United States Patent
Kagata et al.

(10) Patent No.: US 8,823,083 B2
(45) Date of Patent: Sep. 2, 2014

(54) SEMICONDUCTOR DEVICE WITH VERTICAL SEMICONDUCTOR ELEMENT

(71) Applicant: DENSO CORPORATION, Kariya (JP)

(72) Inventors: Yuma Kagata, Kariya (JP); Nozomu Akagi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/634,000

(22) Filed: Oct. 3, 2012

(65) Prior Publication Data

US 2013/0087851 A1    Apr. 11, 2013

(30) Foreign Application Priority Data

Oct. 6, 2011  (JP) ................. 2011-222215
Sep. 21, 2012 (JP) ................. 2012-208177

(51) Int. Cl.
*H01L 29/78* (2006.01)
(52) U.S. Cl.
CPC .................. *H01L 29/7827* (2013.01)
USPC ........................... 257/329; 257/77
(58) Field of Classification Search
USPC ....................................... 257/329
See application file for complete search history.

(56) References Cited

U.S. PATENT DOCUMENTS

| 6,057,558 | A | 5/2000 | Yamamoto et al. |
| 6,291,856 | B1 | 9/2001 | Miyasaka et al. |
| 2004/0056306 | A1 | 3/2004 | Saito et al. |
| 2009/0317959 | A1 | 12/2009 | Takei |
| 2012/0161226 | A1* | 6/2012 | Darwish ........... 257/330 |

FOREIGN PATENT DOCUMENTS

| JP | 2004-072068 A | 3/2004 |
| JP | 2007-019146 A | 1/2007 |
| JP | 2010028018 A | * 2/2010 |

OTHER PUBLICATIONS

Office Action mailed May 13, 2014 issued in corresponding JP patent application No. 2012-208177 (and English translation).

* cited by examiner

*Primary Examiner* — Zandra Smith
*Assistant Examiner* — Damian A Hillman
(74) *Attorney, Agent, or Firm* — Posz Law Group, PLC

(57) ABSTRACT

A semiconductor device includes a vertical semiconductor element having a super junction structure constructed of a first conductivity-type drift layer disposed on a surface of a semiconductor substrate and second conductivity-type regions having a stripe shape defining a longitudinal direction in one direction and being arranged at a predetermined column pitch in the drift layer. When a surplus concentration obtained by dividing a difference between an electrical charge of the second conductivity-type region and an electrical charge of a first conductivity-type region by the column pitch is i, a depth of the super junction structure is z, a surplus concentration gradient as a change of the surplus concentration i per unit depth dz is di/dz, and a central withstand voltage in which a margin is added to a desired withstand voltage is $V_{max}$, the super junction structure is configured such that the surplus concentration gradient di/dz satisfies a relation of $$0 > \frac{di}{dz} > -\left(\frac{7.97 \times 10^{11}}{V_{max}}\right)^2 \cdot \frac{1}{10000}.$$

7 Claims, 14 Drawing Sheets

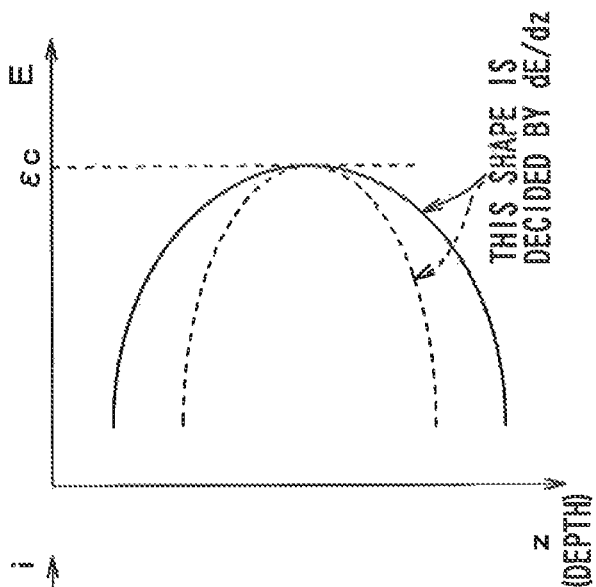
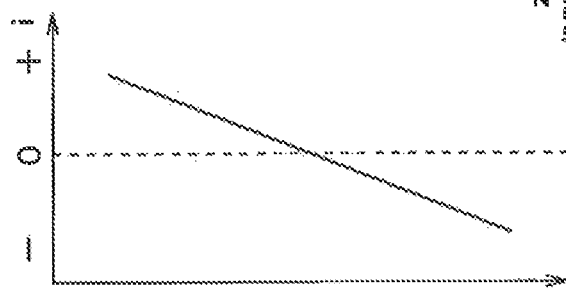
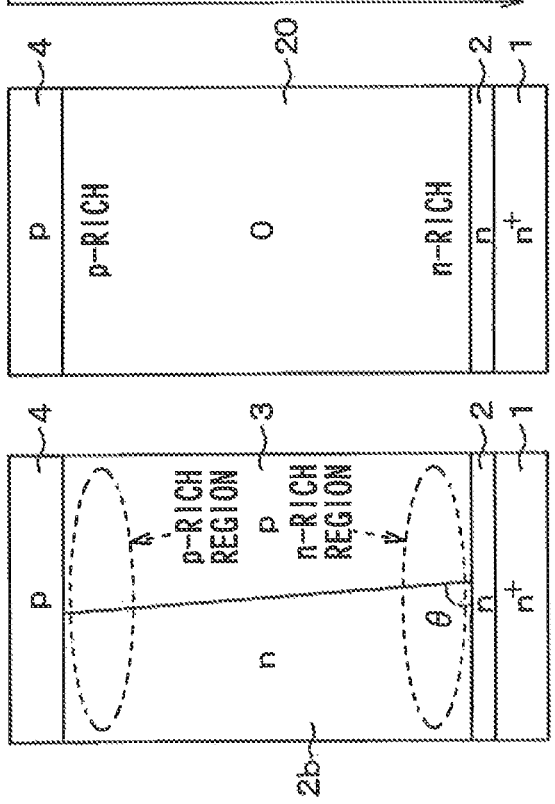

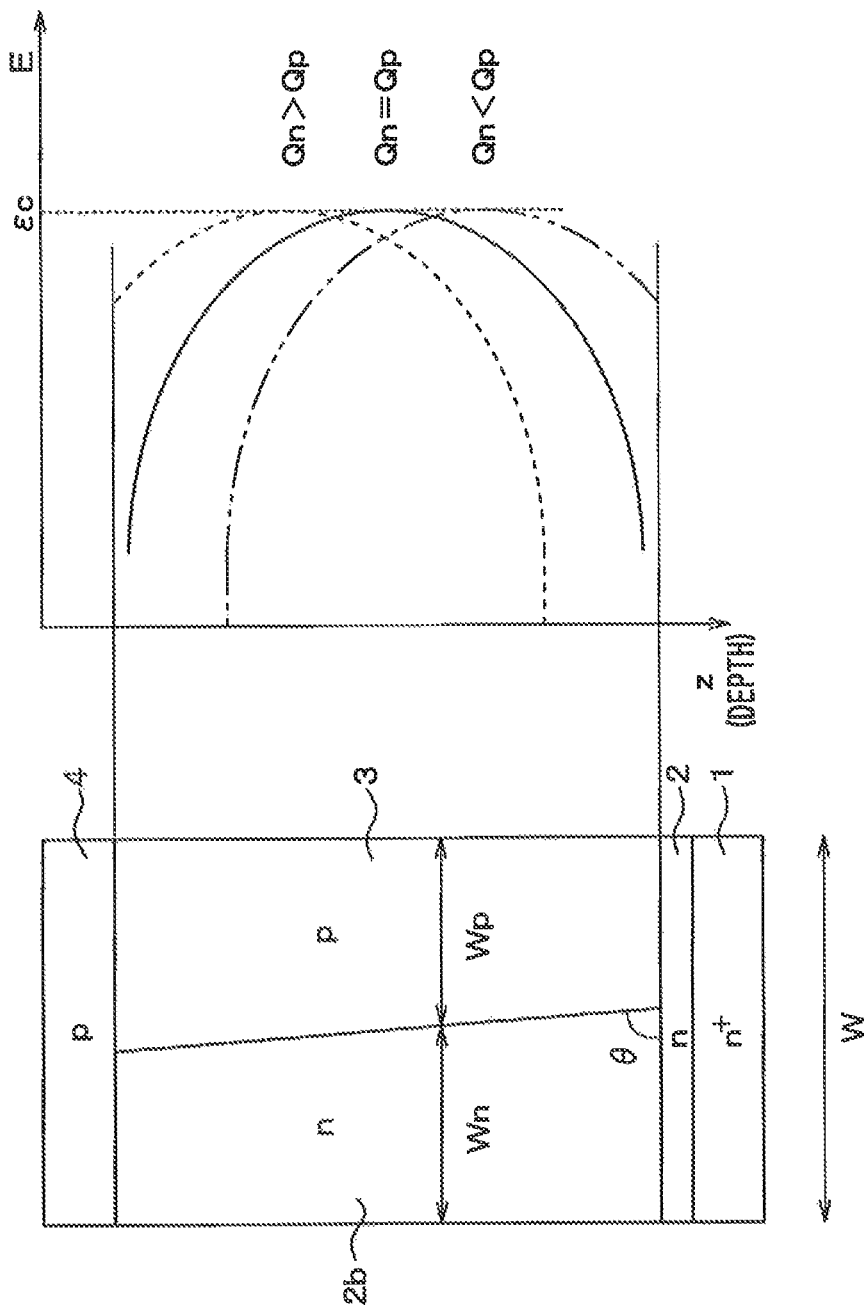

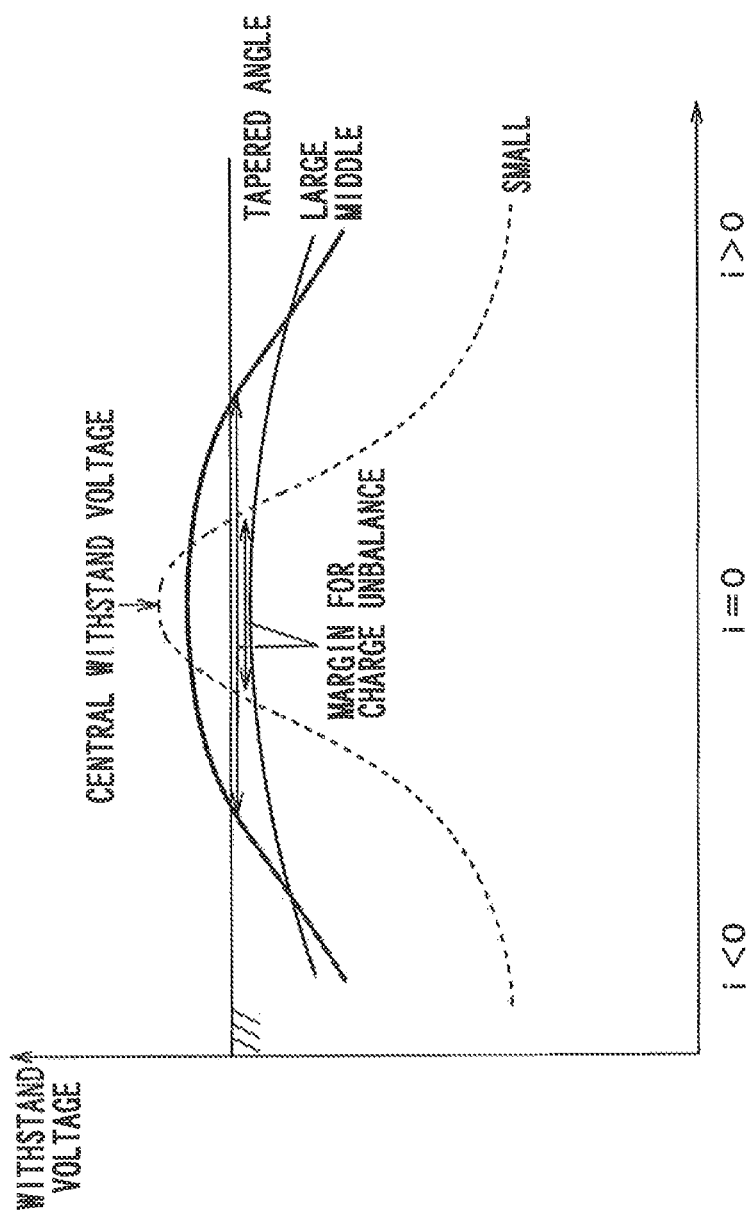

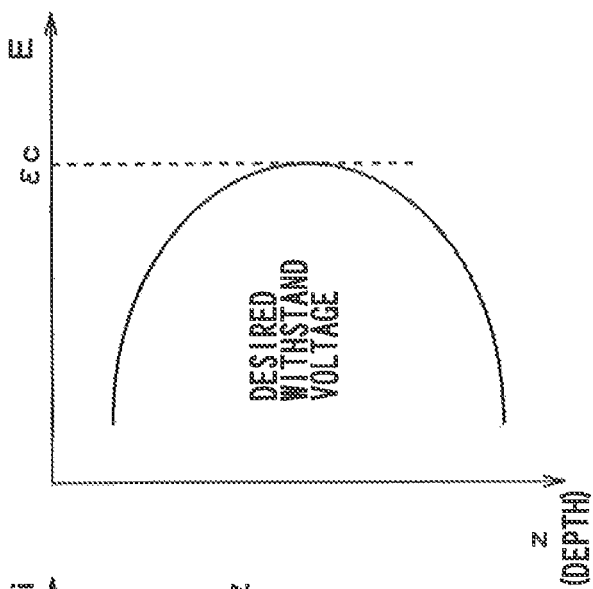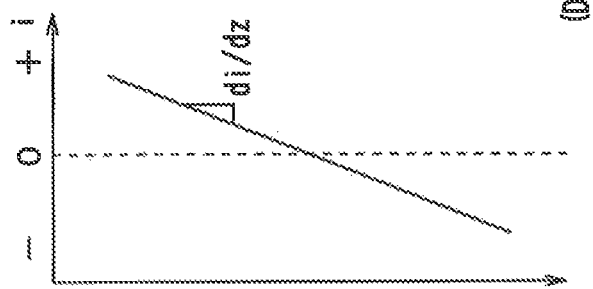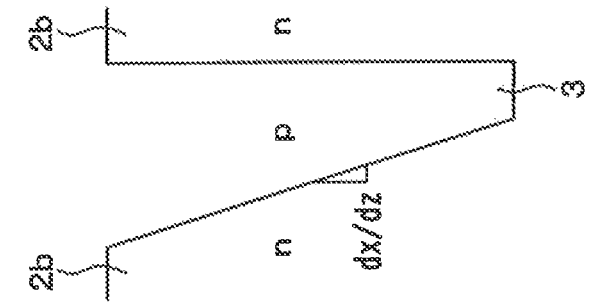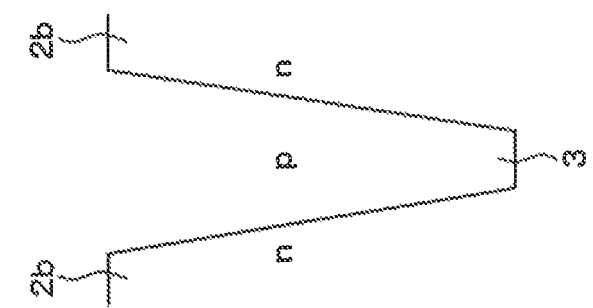

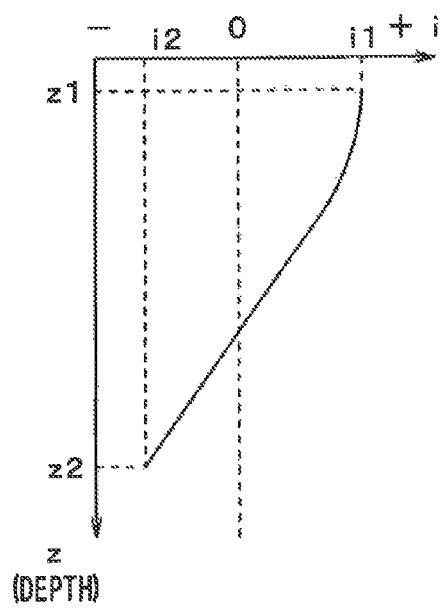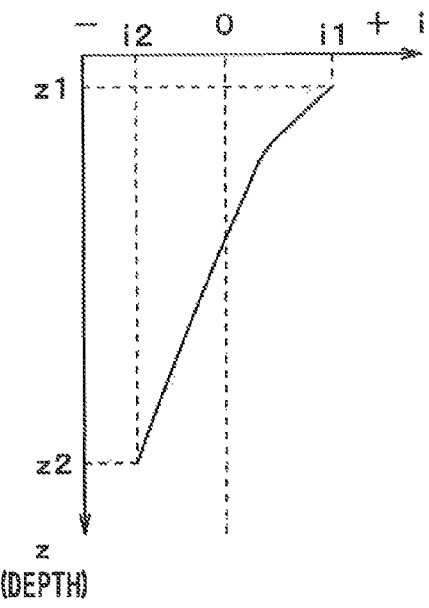

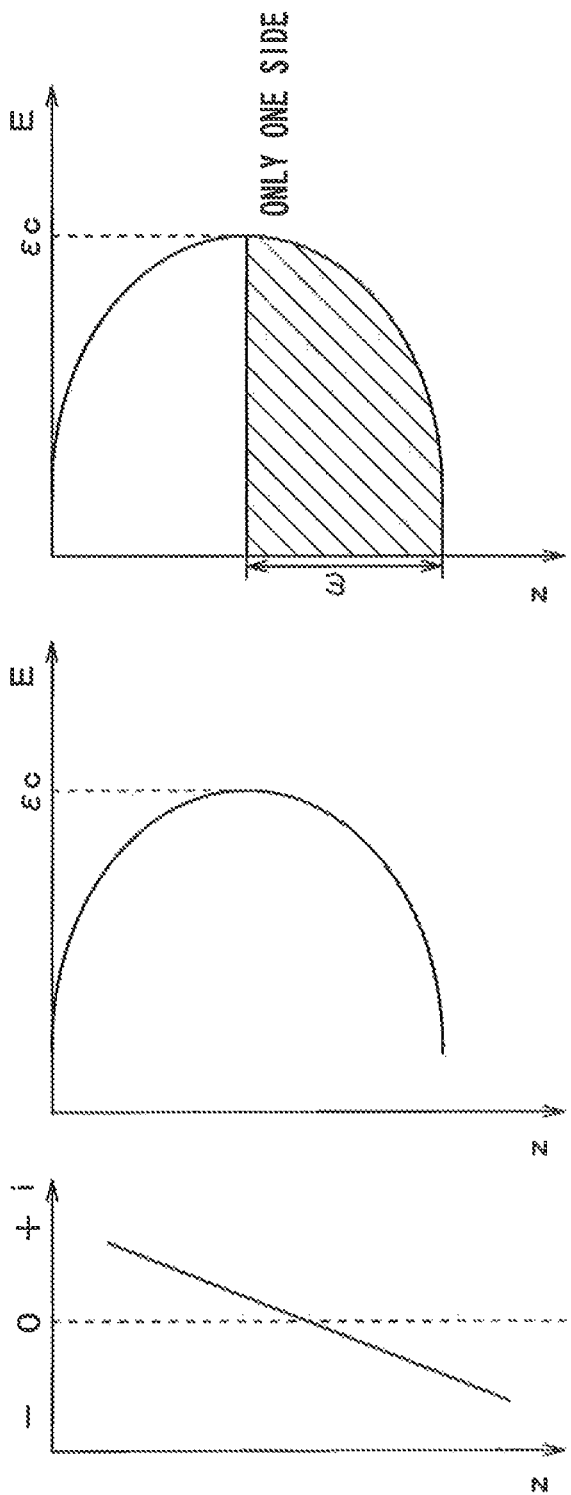

SEMICONDUCTOR DEVICE WITH VERTICAL SEMICONDUCTOR ELEMENT

CROSS REFERENCE TO RELATED APPLICATION

This application is based on Japanese Patent Applications No. 2011-222215 filed on Oct. 6, 2011 and No. 2012-208177 filed on Sep. 21, 2012, the disclosures of which are incorporated herein by reference.

TECHNICAL FIELD

The present disclosure relates to a semiconductor device including a vertical semiconductor element that has a super junction structure made of a structure (column) of n-type regions and p-type regions alternately and repetitively arranged in a from of stripe in a drift layer, and is configured to allow an electric current to flow between a front surface and a rear surface in a substrate.

BACKGROUND

Conventionally, a vertical semiconductor element having a super junction structure, which is made of n-type columns and p-type columns alternately and repetitively arranged in a form of stripe in a drift layer, has been proposed. (For example, see Japanese Patent Application Publications No. 2001-111041 and No. 2010-3970). The most distinctive feature of the super junction structure is the drift layer having n-columns and p-columns repetitively formed therein. The n-columns form a current path in an on state. The p-columns cancel an electrical charge and expand a depletion layer as if there is no electrical charge exists in an off state. Of these elements, the drift layer functions as a major part in regard to an on-state resistance and a withstand voltage. Further, in the super junction structure, the withstand voltage is obtained as a charge balance is achieved by equalizing the amount of electrical charge between the n-columns and the p-columns.

However, a difference may occur between the amount of electrical charge of the n-columns and the amount of the electrical charge of the p-columns due to a processing variation caused when forming the n-columns and the p-columns. If the difference is large, an electrical charge that is not cancelled restricts the depletion layer from expanding. As a result, a desired withstand voltage is not obtained.

In this way, in the semiconductor device with the vertical semiconductor element having the super junction structure, a withstand voltage yield decreases due to the processing variation in forming the n-columns and the p-columns. The decrease of the withstand voltage yield is more prominent as the concentration of the n-columns is increased so as to reduce the on-state resistance. This is because the difference of the amount of the electrical charge between the n-columns and the p-columns caused by the processing variation increases. Therefore, the super junction structure has a trade-off relationship between the on-state resistance and the withstand voltage yield. Further, the trade-off relationship becomes more severe with an increase in withstand voltage.

To address the issue described above, it is considered to incline the p-column in a depth direction such that a side surface of the p-column has a tapered angle. When the side surface of the p-column has the tapered angle, the withstand voltage is less likely to reduce even if the difference occurs between the amount of the electrical charge of the n-column and the amount of the electrical charge of the p-column due to the processing variation. Therefore, because a margin for the processing variation increases, the trade-off relationship between the on-state resistance and the withstand voltage yield improves.

However, if the tapered angle of the side surface of the p-column excessively increases, a central withstand voltage reduces. In this case, therefore, the margin for the processing variation adversely reduces.

A design idea for suppressing the decrease of the withstand voltage by forming the tapered angle on the side surface of the p-column is described hereinabove. Also, the decrease of the withstand, voltage is suppressed based on a concentration relationship between the n-columns and p-columns with respect to the depth direction of the p-column. Also in such a case, the similar drawback described above will arise.

SUMMARY

It is an object of the present disclosure to achieve a margin for a processing variation in a semiconductor device having a super junction structure.

According to an aspect of the present disclosure, a semiconductor device includes a vertical semiconductor element that has a super junction structure made of second conductivity-type regions and first conductivity-type regions, which are alternately and repetitively arranged at a predetermined column pitch, the first conductivity-type regions being provided by regions of a drift layer remained between the second conductivity-type regions. The vertical semiconductor element allows an electric current to flow between a first electrode disposed adjacent to a first surface of a semiconductor substrate and a second electrode disposed adjacent to a second surface of the semiconductor substrate.

When a surplus concentration that is a value obtained by dividing a difference between an electrical charge in the second conductivity-type region and an electrical charge in the first conductivity-type region by the column pitch is referred to as i; a depth of the super junction structure is referred to as z; a surplus concentration gradient that is the amount of change of the surplus concentration i per unit depth dz is referred to as di/dz; and a central withstand voltage obtained by adding a margin to a desired withstand voltage is referred to as Vmax, the super junction structure is configured such that the surplus concentration gradient di/dz satisfies the following expression:

$$O > \frac{di}{dz} > -\left(\frac{7.97 \times 10^{11}}{V_{max}}\right)^2 \cdot \frac{1}{10000} \quad \text{[Expression 1]}$$

The super junction structure is configured such that the surplus concentration gradient satisfies the expression 1. With this configuration, the desired withstand voltage can be achieved without reducing the margin for the processing variation, and the decrease of the withstand voltage yield is restricted.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which:

FIG. 6A to FIG. 6D are diagrams illustrating a way of thinking a withstand voltage when an angle θ is less than 90 degrees;

FIG. 7A is a cross-sectional view of one column of a super junction structure when the angle θ is less than 90 degrees;

FIG. 7B is a diagram illustrating a field intensity distribution according to a magnitude relationship between an electrical charge Qn and an electrical charge Qp in a structure shown in FIG. 7A;

FIG. 8 is a diagram illustrating a relation of a withstand voltage with respect to the magnitude relationship between the electrical charge Qn and the electrical charge Qp;

FIG. 9A to FIG. 9D are explanatory diagrams illustrating an image of assuming a field intensity distribution achieving a desired withstand voltage and introducing the angle θ from the field intensity distribution assumed;

FIG. 12A and FIG. 12B are diagrams illustrating a change of a surplus concentration with respect to a depth z in respective cases of FIG. 11A and FIG. 11b;

FIG. 14A to FIG. 14C are diagrams illustrating a way of thinking the withstand voltage used to derive an expression 1.

DETAILED DESCRIPTION

Figure 1:
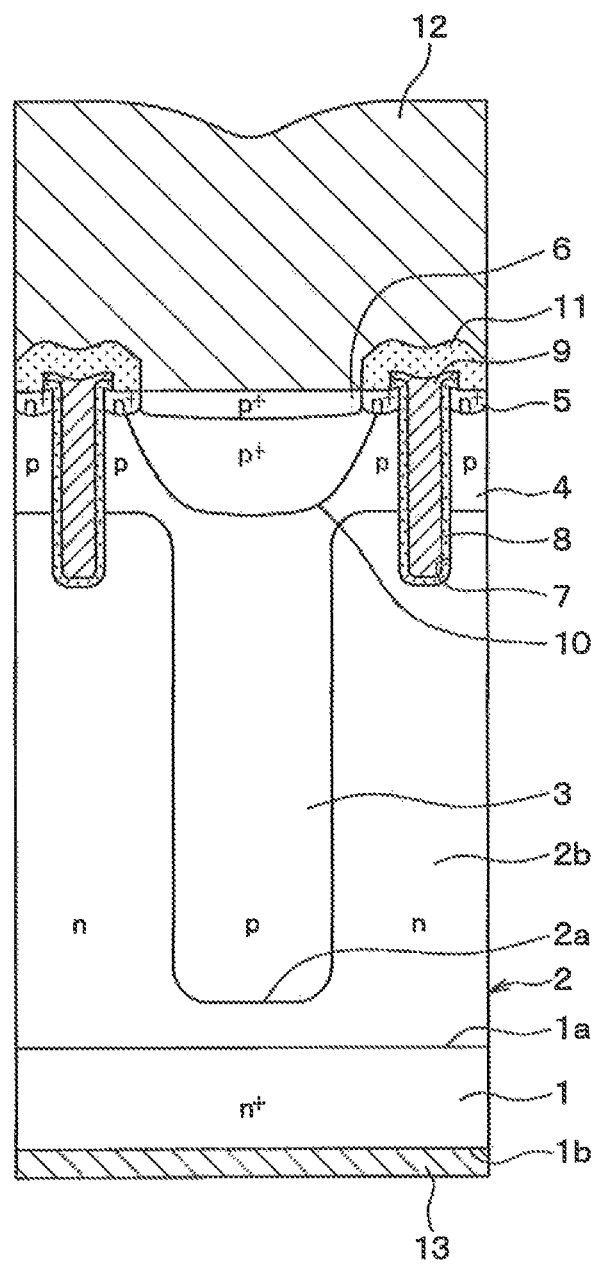
FIG. 1 is a cross-sectional view of a cell region Rc of a semiconductor device having a vertical MOS transistor according to an embodiment of the present disclosure.

Hereinafter, embodiments of the present disclosure will be described with reference to the drawings. It is to be noted that the same or equivalent parts in each embodiment described hereinafter are designated with the same reference numerals in the drawings.

A semiconductor device according to an embodiment of the present disclosure includes a vertical semiconductor element. The vertical semiconductor element has a super junction structure made of first conductivity-type regions 2b and second conductivity-type regions 3 alternately and repetitively arranged at a predetermined column pitch W. The second conductivity-type regions 3 are disposed in the drift layer 2, and the first conductivity-type regions 2b are provided by portions of a drift layer 2 remaining between the second conductivity-type regions 3. The vertical semiconductor element allows an electric current to flow between a first electrode 12 formed adjacent to a first surface of a semiconductor substrate 1 and a second electrode 13 formed adjacent to a second surface of the semiconductor substrate 1. When a surplus concentration that is a value obtained by dividing a difference between an electrical charge Qp in the second conductivity-type regions 3 and an electrical charge Qn in the first conductivity-type regions 2b by the column pitch W is referred to as i; a depth of the super junction structure is referred to as z; a surplus concentration gradient that is an amount of change of the surplus concentration i per unit depth dz is referred to as di/dz; and a central withstand voltage obtained by adding a margin to a desired withstand voltage is referred to as Vmax, the super junction structure is configured such that the surplus concentration gradient satisfies the following expression 1.

$$O > \frac{di}{dz} > -\left(\frac{7.97 \times 10^{11}}{V_{max}}\right)^2 \cdot \frac{1}{10000} \quad \text{[Expression 1]}$$

The super junction structure is configured such that the surplus concentration gradient satisfies the expression 1. With this configuration, the desired withstand voltage can be achieved without reducing the margin for the processing variation, and the decrease in the withstand voltage yield is restricted.

The above expression 1 is derived in the following manner. FIG. 14A to FIG. 4C are diagrams illustrating a way of thinking a withstand voltage used to derive the expression 1.

Firstly, the central withstand voltage Vmax is expressed by an expression 2 using the unit depth dz and a field intensity E. In the super junction structure, in a case where a side surface of the second conductivity-type region 3 is inclined with respect to a depth direction to have a tapered angle, the surplus concentration i varies in accordance with a depth, as shown in FIG. 14A. Based on this, a change of the field intensity E per unit depth dz is expressed by an expression 3 using an electrical charge q and a dielectric constant ∈. In the expression 3, di/dz indicates that the surplus concentration i varies with the depth z. Further, when the surplus concentration i is replaced with the field intensity E, the field intensity E is indicated as shown in FIG. 14B. Moreover, the field intensity E is calculated by an integral of dE/dz as indicated by an expression 4.

$$V_{max} = \int E dz \quad \text{[Expression 2]}$$

$$\frac{dE}{dz} = \frac{q}{\varepsilon} \cdot \frac{di}{dz} \cdot z \quad \text{[Expression 3]}$$

$$E(z) = \varepsilon_c + \int \frac{dE}{dz} \cdot dz \quad \text{[Expression 4]}$$
$$= \varepsilon_c + \frac{q}{2\varepsilon} \cdot \frac{di}{dz} \cdot z^2$$

As shown in FIG. 14C, a depletion layer width ω is defined by one side of the depth, that is, by one-half of the column pitch W when the field intensity E is zero. ω is derived as in an expression 6 by transforming the expression 5 into an expression of ω. Because the column pitch W is 2ω, the column pitch W is defined as an expression 7. The expression 1 is derived by transforming this expression into an expression of di/dz, $$O = \varepsilon_c + \frac{q}{2\varepsilon} \cdot \frac{di}{dz} \cdot z^2 \qquad \text{[Expression 5]}$$

$$\omega = \sqrt{\frac{2\varepsilon_c \cdot \varepsilon}{q} \cdot \frac{dz}{di}} \qquad \text{[Expression 6]}$$

$$W = 2\omega \qquad \text{[Expression 7]}$$

$$W = 2\sqrt{-\frac{2\varepsilon_c \cdot \varepsilon}{q} \cdot \frac{dz}{di}}$$

Next, a way of deriving $di/dz = -a/V_{max})^2$ will be explained. Firstly, the central withstand voltage $V_{max}$ is calculated by doubling an integral of the field intensity E with regard to the one side of FIG. 14C. The central withstand voltage $V_{max}$ is expressed as an expression 8 by substituting the depletion layer width $\omega$(½ W).

$$\begin{aligned} V_{max} &= \int_0^\omega E dz \times 2 \qquad \text{[Expression 8]} \\ &= \left[ \varepsilon_c z + \frac{q}{6\varepsilon} \cdot \frac{di}{dz} \cdot z^3 \right]_0^\omega \times 2 \\ &= \left( \varepsilon_c \omega + \frac{q}{6\varepsilon} \cdot \frac{di}{dz} \cdot \omega^3 \right) \times 2 \\ &= \left( \varepsilon_c + \frac{q}{6\varepsilon} \cdot \frac{di}{dz} \cdot \frac{2\varepsilon_c \cdot \varepsilon}{q} \cdot \frac{dz}{di} \right) \times 2\omega \\ &= \left( \varepsilon c - \frac{1}{3} \varepsilon_c \right) \times 2\omega \\ &= \frac{4}{3} \varepsilon_c \sqrt{\frac{2\varepsilon_c \cdot \varepsilon}{q} \cdot \frac{dz}{di}} \end{aligned}$$

$$V_{max}^2 = -\frac{16}{9} \varepsilon_c^2 \frac{2\varepsilon_c \cdot \varepsilon}{q} \cdot \frac{dz}{di} \qquad \text{[Expression 9]}$$

$$\begin{aligned} \frac{di}{dz} &= -\frac{32}{9} \cdot \frac{\varepsilon_c^3 \cdot \varepsilon}{q} \cdot \frac{1}{V_{max}^2} \qquad \text{[Expression 10]} \\ &= -\left( \sqrt{\frac{32}{9} \cdot \frac{\varepsilon_c^3 \cdot \varepsilon}{q}} \cdot \frac{1}{V_{max}} \right)^2 \\ &= -\left( a \cdot \frac{1}{V_{max}} \right)^2 \end{aligned}$$

The expression 9 is derived by squaring both sides of the expression 8. The expression 10 is derived by transforming the expression 9 into an expression of di/dz. Further, $di/dz = -(a/V_{max})^2$ is derived by defining a coefficient of $1/V_{max}$ as $a^2$ in the expression 10. Furthermore, when a is calculated for each withstand voltage required by defining a breakdown field intensity as $\in C = 0.3$ MV/cm and a dielectric coefficient of silicon as $\in = \in 0 \times \in si$, each of surplus concentration gradients described hereinafter can be calculated. It is noted that $\in 0$ is a vacuum dielectric coefficient ($\in 0 = 8.85 \times 10^{-14}$ F/cm), and $\in si$ is a specific dielectric coefficient of the silicon ($\in si$ 11.9).

In an embodiment, the depth of the second conductivity-type region 3 is smaller than the thickness of the drift layer 2, and the drift layer 2 exists under the second conductivity-type region 3.

In this way, in a state where the drift layer 2 remains under the second conductivity-type region 3, it is less likely that the electric field will be increased at a lower part of the super junction structure and the central withstand voltage will be reduced.

In an embodiment, when the width of the first conductivity-type region 2b is referred to as Wn and the impurity concentration of the first conductivity-type region 2b is referred to as Nn, both the side surfaces of the second conductivity-type region 3 form the angle θ relative to a planar direction of the substrate, and the angle θ satisfies the following expression:

$$\arctan\left( -2 \cdot \frac{1}{W - W_n} \cdot N_n \cdot \frac{1}{di/dz} \right) \times \frac{360}{2\pi} < \theta < 90^\circ \qquad \text{[Expression 11]}$$

In this way, a case where the tapered angle is formed by inclining the side surface of the second conductivity-type region 3 with respect to the depth direction in the super junction structure, the angle θ defined between the side surface of the second conductivity-type region 3 and the planar direction of the substrate satisfies the expression described above. By setting the angle θ in this manner, the desired withstand voltage is achieved without reducing the margin for the processing variation, and the decrease in withstand voltage yield is restricted.

For example, when the vertical semiconductor element is set to have a withstand voltage of equal to or greater than 300 V, the surplus concentration gradient is set as less than $-3.9 \times 10^{14}$ cm$^{-3}$ µm$^{-1}$. When the vertical semiconductor element is set to have a withstand voltage of equal to or greater than 600 V, the surplus concentration gradient is set as less than $-1.1 \times 10^{14}$ cm$^{-3}$ µm$^{-1}$. When the vertical semiconductor element is set to have a withstand voltage of equal to or greater than 1200 V, the surplus concentration gradient is set as less than $-3.0 \times 10^{13}$ cm$^{-3}$ µm$^{-1}$.

As the vertical semiconductor element of such a semiconductor device, a vertical semiconductor element described hereinafter will be considered. Namely, the vertical semiconductor element has a gate structure, a second conductivity-type contact region 6, a first electrode 12 and a second electrode 13. The gate structure is constructed of a second conductivity-type base region 4 disposed on the super junction structure, a first conductivity-type first impurity region 5 having an impurity concentration greater than the drift layer 2, a gate insulation film 8 formed on a surface of the drift layer 2, and a gate electrode 9 formed on a surface of the gate insulation film 8. The second conductivity-type contact region 6 is formed in a surface layer portion of the base region 4 opposite to the first conductivity-type region 2b with respect to a trench 7. The second conductivity-type contact region 6 has an impurity concentration greater than the base region 4. The first electrode 12 is electrically coupled to the first impurity region 5 and the contact region 6. The second electrode 13 is electrically coupled to the semiconductor substrate 1. The vertical semiconductor element allows an electric current to flow between the first electrode 12 and the second electrode 13 according to a voltage applied to the gate electrode 9.

Figure 2:
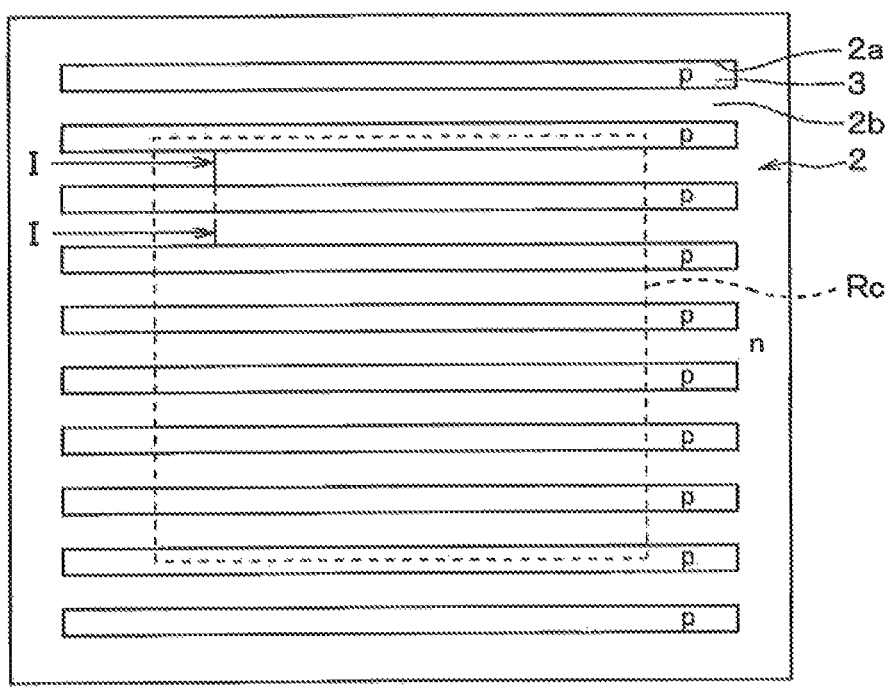
FIG. 2 is a diagram illustrating a layout of the semiconductor device shown in FIG. 1.

Hereinafter, a semiconductor device having a vertical semiconductor element according to an embodiment of the present disclosure will be described more in detail. In the present embodiment, a semiconductor device having a vertical MOS transistor as the vertical semiconductor element will be explained as an example. FIG. 1 is a cross-sectional view of a cell region Rc of the semiconductor device having the vertical MOS transistor according to the present embodiment. FIG. 2 is a diagram illustrating a layout of the semiconductor device shown in FIG. 1. FIG. 1 corresponds to a cross-sectional view taken along a line I-I in FIG. 2. Hereinafter, the semiconductor device having the vertical MOS transistor will be described with reference to these drawings.

The semiconductor device of the present embodiment shown in FIG. 1 is provided with a trench-gate structure reversed-type vertical MOS transistor, as the vertical MOS transistor. As shown in FIG. 1, the vertical MOS transistor is formed using an n$^+$-type substrate 1 made of a single crystal semiconductor such as a single crystal silicon. The n$^+$-type substrate 1 has one surface as a front surface (first surface) 1a and a surface opposite to the front surface 1s as a rear surface (second surface) 1b. For example, an n-type impurity concentration of the n$^+$-type substrate 1 is $1\times10^{19}$ cm$^{-3}$. On the front surface 1a of the n$^+$-type substrate 1, an n-type drift layer 2 having an n-type impurity concentration of, for example, $8.0\times10^{15}$ cm$^{-3}$ is formed.

In the n-type drift layer 2, as shown in FIG. 2, trenches 2a having a stripe shape defining a longitudinal direction in one direction (left and right direction of a paper surface of FIG. 2) are formed. The trenches 2a are arranged at an equal interval in a direction perpendicular to the longitudinal direction. Further, as shown in FIG. 1, p-type regions (p-type columns) 3 are formed to fill the trenches 2a. The p-type regions 3 has a p-type impurity concentration of $8.0\times10^{15}$ cm$^{-3}$, for example. With this, as shown in FIG. 1, portions of the n-type drift layer 2 remaining between the trenches 2a are provided as n-type regions (n-columns) 2b. The super junction structure is made of the n-type regions 2b and the p-type regions 3, which are formed in the stripe shape and are alternately and repetitively arranged at an equal interval.

For example, when it is expected to have a withstand voltage of approximately 600 V by the super junction structure, the depth of the n-type drift layer 2 is set at 30 to 50 μm, for example, at 45 μm, and a pitch (column pitch) of the n-type regions 2b and the p-type regions 3 is set at 6.0 μm. Also, a width ratio of the n-type regions 2b and the p-type regions 3 is set at 1:1 so that an area ratio of the n-type regions 2b and the p-type regions 3 is 1:1 in the cell region Rc. Further, the super junction structure is configured such that a side surface of the trench 2a is inclined with respect to the depth direction to have a tapered angle so as to ensure the withstand voltage even if the processing variation occurs. Furthermore, an angle θ (=tapered angle) of the side surface of the trench 2a, that is, an angle of an interface between the adjacent n-type region 2b and p-type region 3 relative to a planar direction of the substrate is, for example, equal to or greater than 88.8 degrees and less than 90 degrees. It is to be noted that the angle θ means an angle of the side surface of the trench 2a relative to the planar direction of the substrate when the trench 2a has a forward taper shape where the width of the p-type region 3 gradually reduces in the depth direction. When the trench 2a has a reverse taper shape where the width of the p-type region 3 gradually increases in the depth direction, the margin reduces. Therefore, a structure where the angle θ is in the range described above but in the case of the reverse taper shape is not included in the scope of the present disclosure.

A p-type base region 4 is formed on surfaces of the n-type regions 2b and the p-type regions 3. For example, the p-type base region 4 has a p-type impurity concentration of $1.0\times10^{17}$ cm$^{-3}$, and a depth of 1.0 μm. On a surface layer portion of the p-type base region 4, n$^+$-type impurity regions 5 and p$^+$-type contact regions 8 are formed. The n$^+$-type impurity region 5 has an impurity concentration greater than the n-type drift layer 2 and serves as a source region. The p$^+$-type contact region 6 has an impurity concentration greater than the p-type base region 4. For example, the n$^+$-type impurity region 5 has an n-type impurity concentration of $1.0\times10^{20}$ cm$^{-3}$, and a depth of 0.4 μm. The p$^+$-type contact region 6 is arranged opposite to a trench-gate structure, which will be described later, with respect to the n$^+$-type impurity region 5 within the surface layer portion of the p-type base region 4. For example, the p$^+$-type contact region 6 has a p-type impurity concentration of $1.0\times10^{20}$ cm$^{-3}$, and a depth of 0.4 μm.

Also, plural trenches 7 are formed at an equal interval. The trench 7 passes through the n$^+$-type impurity region 5 and the p$^+$-type base region 4 and reaches the n-type region 2b. The trench 7 defines a longitudinal direction in a direction perpendicular to the paper surface of FIG. 1. In the present embodiment, the trench 7 is arranged at a position corresponding to the n-type region 2b, and the p-type region 3 is disposed between the adjacent trenches 7. Further, a gate insulation film 8 is formed to cover a surface of the trench 7. A gate electrode 9 is formed on the surface of the gate insulation film 8 to fill the trench 7. The gate electrode 9 is made of a doped poly-Si or the like. The trench gate structure is formed by these elements. Although the trench 7 for forming the trench gate structure is not illustrated in FIG. 2, the trenches 7 are extended such that the longitudinal direction of the trenches 7 accord with the longitudinal direction of the trenches 2a that forms the super junction structure. For example, the depth of the trench 7 is 3.5 μm, and the width of the trench 7 is 1.0 μm.

Further, a p$^+$-type body layer 10 having a p-type impurity concentration greater than the p-type base region 4 is formed in between the trenches 7. For example, the p$^+$-type body layer 10 has a p-type impurity concentration of $1.0\times10^{19}$ cm$^{-3}$, and a depth of 2.0 μm.

Also, an interlayer insulation film 11 is formed above the trench gate structure to cover the gate electrode 9. Further, a front-surface electrode (source electrode, first electrode) 12 is formed such that the surface electrode 12 is electrically coupled to the n$^+$-type impurity region 5 and the p$^+$-type contact region 6 through contact holes formed in the interlayer insulation film 11. Also, a rear-surface electrode (drain electrode, second electrode) 13 is formed on the rear surface 1b of the n$^+$-type substrate 1, which provides a drain region. In this way, the vertical MOS transistor is structured.

The vertical MOS transistor structured as described above operates in the following manner, for example. When a gate voltage is not applied to the gate electrode 9, a channel is not formed in the surface layer portion of the p-type base region 4. Therefore, an electric current between the front-surface electrode 12 and the rear-surface electrode 13 is prevented. When the gate voltage is applied, the channel is formed as the conductivity-type of a portion of the p-type base region 4 contacting the side surface of the trench 7 is reversed according to a value of the voltage. Therefore, the electric current flows between the front-surface electrode 12 and the rear-surface electrode 13.

In this vertical MOS transistor, it is configured such that the side surface of the trench 2a, that is, the side surface of the p-type region 3 is inclined at an angle θ of 88.8 degrees relative to the planar direction of the substrate. Setting of the angle θ will be described with reference to FIG. 3A to FIG. 9.

Firstly, a case where the angle θ is 90 degrees, that is, the side surface of the p-type region 3 is not inclined with respect to the depth direction will be considered. FIG. 3A is a cross-sectional view of one column of the super junction structure of this case. In this case, a width of the n-type region 2b is referred to as Wn, a width of the p-type region 3 is referred to as Wp, the column pitch is referred to as W, the impurity concentration of the n-type region 2b is referred to as Nn, the impurity concentration of the p-type region 3 is referred to as Np, the electrical charge contained in the n-type region 2b is referred to as Qn, and the electrical charge contained in the p-type region 3 is referred to as Qp.

Figure 3B:
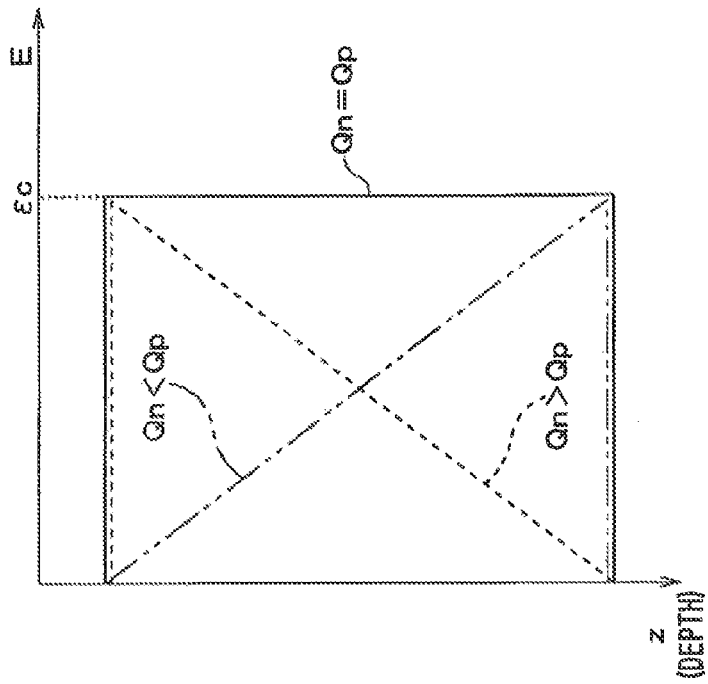
FIG. 3B is a diagram illustrating a field intensity distribution according to a magnitude relationship between an electrical charge Qn and an electrical charge Qp in a cross-section shown in FIG. 3A.
Figure 3A:
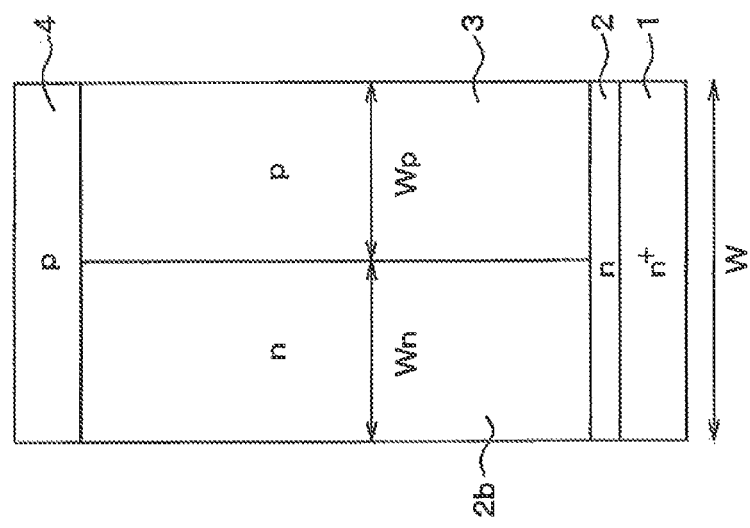
FIG. 3A is a cross-sectional view of one column of a super junction structure.

In a structure where the side surface of the p-type region 3 is not inclined with respect to the depth direction, as shown in FIG. 3A, a field intensity distribution according to a magnitude relationship between the electrical charge Qn and the electrical charge Qp is depicted as shown by a solid line in FIG. 3B. That is, when the electrical charge Qn and the electrical charge Qp are equal to each other (Qn=Qp), the field intensity distribution is uniform in the depth direction. At any position in the depth direction, a breakdown electric field intensity ∈c, that is, the electric field intensity causing an avalanche breakdown is the same. When the electrical charge Qn is greater than the electrical charge Qp, (Qn>Qp), the electric field intensity increases with the decrease in depth, and reduces with the increase in depth. On the other hand, when the electrical charge Qn is smaller than the electrical charge Qp (Qn<Qp), the electric field intensity reduces with the decrease in depth, and increases with the increase in depth. In this way, the field intensity distributions are different according to the magnitude relationship between the electrical charge Qn and the electrical charge Qp, and the withstand voltage is defined by the area surrounded by the field intensity distributions. Therefore, when the electrical charge Qn and the electrical charge Qp are equal to each other, that is, when the electrical charge is balanced, the withstand voltage is the highest.

Figure 4:
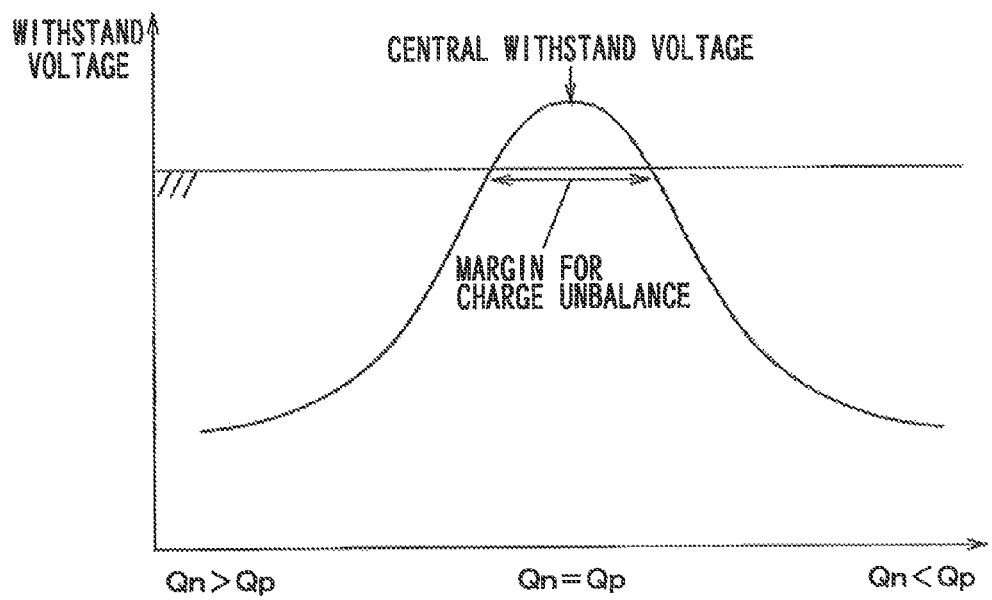
FIG. 4 is a diagram illustrating a relation of a withstand voltage with respect to the magnitude relationship between the electrical charge Qn and the electrical charge Qp.
Figure 5:
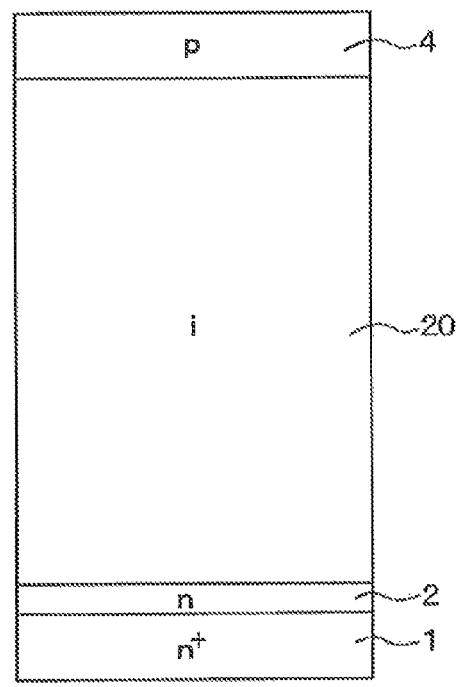
FIG. 5 is a schematic diagram when the structure of FIG. 3A is regarded as a surplus concentration layer 20 having a surplus concentration i.

Here, the withstand voltage corresponding to the magnitude relationship between the electrical charge Qn and the electrical charge Qp based on the field intensity distributions is shown in FIG. 4. An area achieving a desired withstand voltage or more is a certain area centering on a central withstand voltage where the withstand voltage is the highest, that is, a position satisfying Qn=Qp. This area corresponds to an area allowed as a margin for charge unbalance.

Further, when a concentration of the electrical charge that remains without being cancelled in the off state is defined as a surplus concentration i, the surplus concentration i is expressed by the following expression. Therefore, when the structure of FIG. 3A is regarded as a surplus concentration layer 20 having the surplus concentration i, the structure of FIG. 3A can be considered as a diagram shown in FIG. 5.

$$i=(Qp-Qn)/W \qquad \text{[Expression 12]}$$

In fact, the field intensity distribution exists in the planar direction of the substrate (lateral direction). Therefore, the surplus concentration i should be defined by considering the electric field intensity in the planar direction in addition to the field intensity distribution in the depth direction (vertical direction). However, the electric field intensity in the depth direction is more dominant than the electric field intensity in the planar direction of the substrate. Therefore, the field intensity distribution in the planar direction of the substrate is disregarded. The electrical charge Qn and the electrical charge Qp in the expression 12 are expressed by the following expressions 13 and 14. Therefore, the surplus concentration i can be expressed based on the impurity concentration and the width Wn, Wp of the n-type region 2b and the p-type region 3.

$$Qn=Nn \times Wn \qquad \text{[Expression 13]}$$

$$Qp=Np \times Wp \qquad \text{[Expression 14]}$$

Next, a case where the above condition is applied to a structure in which the angle θ is less than 90 degrees and the side surface of the p-type region 3 is inclined with respect to the depth direction to have the tapered angle will be considered. FIG. 6A to FIG. 6D are diagrams illustrating a way of thinking the withstand voltage when the angle θ is less than 90 degrees. In these drawings, it is depicted in regard to a case where the impurity concentration is assumed to be equal between the n-type region 2b and the p-type region 3.

In a case where one column of the super junction structure is illustrated in a cross-section as shown in FIG. 6A, the width Wp of the p-type region 3 is greater than the width Wn of the n-type region 2b at the top layer portion of the n-type region 2b and the p-type region 3 due to the angle θ. Therefore, the top layer portion of the n-type region 2b and the p-type region 3 corresponds to a region where the amount of the electrical charge of the p-type impurity is large. On the other hand, a bottom layer portion of the n-type region 2b and the p-type region 3 corresponds to a region where the amount of the electrical charge of the n-type impurity is large as the width Wn of the n-type region 2b is greater than the width Wp of the n-type region 3. Therefore, as shown in FIG. 6B, in the super junction structure where the angle θ is less than 90 degrees, it is considered that the top layer is in a p-rich state, a middle portion is in a zero state (pn balanced), and the bottom layer is in an n-rich state. Further, as shown in FIG. 6C, the surplus concentration i varies at a constant rate such that the surplus concentration i has a positive value (+) at the top layer portion, reduces to zero according to the depth, and reduces to a negative value (−) at the bottom layer portion.

In the case where the surplus concentration i varies in this manner, the electric field intensity is indicted as shown in FIG. 6D by replacing the surplus concentration i with the electric field intensity. That is, when the depth is referred to as z, the electric field intensity is referred to as E, the electrical charge is referred to as q, the dielectric constant is referred to as ∈, the following expression is derived, as a change in electric field intensity dE per unit depth dz, based on a Poisson's equation.

$$dE/dz=qi/\in \qquad \text{[Expression 15]}$$

Based on this expression, the field intensity distribution is indicated as shown in FIG. 6D. As shown in FIG. 6D, the field intensity distribution forms a parabola having the breakdown electric field intensity at the vertex, and the vertex of the parabola corresponds to a middle position of the super junction structure in the depth direction. An expansion of the parabola (shape of the parabola) is determined by dE/dz, and the dE/dZ varies depending on the surplus concentration i of the expression 15. Therefore, the electric field intensity is determined by the value of the surplus concentration that is, the angle θ.

Further, the field intensity distribution according to the magnitude relationship between the electrical charge Qn and the electrical charge Qp will be considered. FIG. 7A is a diagram illustrating a cross-section of one column of the super junction structure when the angle θ is less than 90 degrees. FIG. 7B is a diagram illustrating the field intensity distribution according to the magnitude relationship between the electrical charge Qn and the electrical charge Qp in that case.

As shown in FIG. 7A, the width Wn of the n-type region 2b and the width Wp of the p-type region 3 vary with respect to the depth direction. The width Wn increases with the depth, and the width Wp reduces with the depth. The depth where the electric field intensity is the maximum is different depending on the magnitude relationship between the electrical charge Qn and the electrical charge Qp at the middle position in the depth direction (position where the width Wn and the width Wp are equal to each other). The field intensity distributions are indicated as shown in FIG. 7B.

Further, the withstand voltage is decided by an area of the region surrounded by the field intensity distribution. When the charge balance is achieved at the middle position in the depth direction and the electrical charge Qn and the electrical charge Qp are equal to each other, the vertex of the field intensity distribution is located at a middle of the super junction structure in the depth direction. Therefore, the area of the region surrounded by the field intensity distribution is the maximum, and the withstand voltage is the maximum. On the other hand, when the charge balance is not achieved at the middle position in the depth direction and the electrical charge Qn and the electrical charge Qp are not equal to each other, the vertex of the field intensity distribution is offset from the middle of the depth of the super junction structure. Therefore, the area of the region surrounded by the field intensity distribution reduces by this amount and the withstand voltage reduces.

As the withstand voltage is examined by changing the angle θ, a relation of the withstand voltage according to the magnitude relationship between the electrical charge Qn and the electrical charge Qp is indicated as shown in FIG. 8. That is, it is appreciated that the relation of the withstand voltage according to the magnitude relationship between the electrical charge Qn and the electrical charge Qp is different according to the angle θ, in addition to the difference in withstand voltage according to the magnitude relationship between the electrical charge Qn and the electrical charge Qp. Therefore, it is appreciated that the range estimated as the margin for the charge unbalance is different according to the angle θ. Further, the angle θ has a correlation with a gradient of the surplus concentration i (hereinafter, referred to as a surplus concentration gradient). Therefore, the angle θ is calculated from the surplus concentration gradient.

Calculation of the angle θ based on the surplus concentration gradient will be explained with reference to FIG. 9A to FIG. 9D. FIG. 9A to FIG. 9D are explanatory diagrams illustrating an image of assuming a field intensity distribution having a desired withstand voltage and deriving the angle θ from the field intensity distribution assumed.

First, as shown in FIG. 9A, it is assumed that the area of the region surrounded by the field intensity distribution within the super junction structure has the desired withstand voltage. For example, various withstand voltages are assumed as the desired withstand voltage, such as 300 V, 600 V, and 1200 V, depending on the intended use. A value of integral obtained by integrating the electric field intensity in the depth direction of the super junction structure is the desired withstand voltage.

Further, an operational expression of the desired withstand voltage is expressed as a Poisson's equation. Therefore, the surplus concentration gradient di/dz required to obtain the desired withstand voltage can be calculated from the expression. When the breakdown electric field intensity is defined as 0.3 MV/cm, a relationship between the desired withstand voltage and the surplus concentration gradient is expressed by the following expression:

$$di/dz = -(7.94 \times 10^{11}/V_{max})^2/10000$$

Here, the Vmax indicates the central withstand voltage in which the margin is added to the desired withstand voltage. Therefore, when the expression 1 described above is satisfied, the desired withstand voltage is achieved without reducing the margin for the processing variation, and the withstand voltage yield will not be reduced.

For example, when the desired withstand voltage is 300 V, the surplus concentration gradient is less than $-3.9 \times 10^{14}$ cm$^{-3}$ μm$^{-1}$. When the desired withstand voltage is 600 V, the surplus concentration gradient is less than $-1.1 \times 10^{14}$ cm$^{-3}$ μm$^{-1}$. When the desired withstand voltage is 1200 V, the surplus concentration gradient is less than $-3.0 \times 10^{13}$ cm$^{-3}$ μm$^{-1}$.

Further, since the surplus concentration gradient satisfying the desired withstand voltage is achieved by inclining the side surface of the p-type region 3, the angle θ necessary to achieve the desired withstand voltage can be obtained by calculating the angle θ corresponding to this surplus concentration gradient.

In regard to the angle θ corresponding to the surplus concentration gradient, first, a state where only one side surface of the p-type region 3 is inclined, as the inclination of the side surface of the p-type region 3 corresponding to the surplus concentration gradient, as shown in FIG. 9C, is assumed. Further, the angle θ corresponding to the surplus concentration gradient is calculated by replacing the state with an actual state, as shown in FIG. 9D, in which both side surfaces of the p-type region 3 are inclined.

In particular, when only one side surface of the p-type region 3 is inclined, the inclination is expressed by defining the amount of change of the width x of the p-type region 3 per unit depth (hereinafter referred to as a column width change amount) as dx/dz, in which dz is the unit depth. In the actual structure, as the column width change amount is achieved by both the side surfaces, the inclination of one side surface is obtained by dividing the column width change amount dx/dz by two. The inclination of the side surface corresponds to the angle θ. Therefore, the following expression can be derived.

$$\tan\theta = \frac{dz}{\frac{1}{2}dx} \quad \text{[Expression 16]}$$

When this expression is solved for the angle θ, the following expression is derived. Accordingly, the angle θ can be expressed as the expression of the column width change amount dx/dz, $$\theta = \arctan\left(2 \cdot \frac{dz}{dx}\right) \times \frac{360}{\pi} \quad \text{[Expression 17]}$$

Further, by transforming the surplus concentration gradient di/dz into the column width change amount dx/dz, the expression in which the angle θ is expressed by the surplus concentration gradient di/dz is obtained. This surplus concentration gradient di/dz is transformed into the column width change amount dx/dz in the following manner.

First, it is defined that, relative to a unit depth delta z, the surplus concentration i changes by Δi, the width of the n-type region 2b increases by Δx, and the width of the p-type region 3 reduces by Δx. In this case, because Δi is expressed as a difference between the electrical charge Qp of the p-type region 3 and the electrical charge Qn of the n-type region 2b, the following expression is established.

$$\Delta i = \{Np \times (Wp - \Delta x) - Nn \times (Wn + \Delta x)\}/W \quad \text{[Expression 18]}$$

Here, Np×(Wp−Δx), which is the first item on the right side, is obtained by calculating the electrical charge Qp at the position deeper than the depth where the width of the p-type region 3 is Wp by the unit depth. Also, Nn×(Wn+Δx), which is the second item of the right side, is obtained by calculating the electrical charge Qn at the position deeper than the depth where the width of the n-type region 2b is Wn by the unit depth.

Further, at the central withstand voltage where the withstand voltage is the maximum, the charge balance is achieved. Therefore, the electrical charge Qp of the p-type region 3 and the electrical charge Qn of the n-type region 2b are equal to each other, and a relation of Qp=Qn is established. Therefore, the following expression is obtained.

$$Nn \times Wn = Np \times Wp \quad \text{[Expression 19]}$$

Further, the width Wp of the p-type region 3 is obtained by subtracting the width Wn of the n-type region 2b from the column pitch W(=W−Wn). Therefore, the expression 20 is derived by substituting the width Wp for the expression 19. Further, the expression 21 is derived by transforming the expression 20 into the expression of the impurity concentration Np of the p-type region 3.

$$Nn \times Wn = Np \times (W - Wn) \quad \text{[Expression 20]}$$

$$Np = Nn Wn / (W - Wn). \quad \text{[Expression 21]}$$

Further, the following expression is derived by substituting the expression 17 and the expression 19 for the expression 16.

$$\Delta i = \frac{\frac{N_n \cdot W_n}{W - W_n} \times \{(W - W_n) - \Delta x\} - N_n \times (W_n + \Delta x)}{W} \quad \text{[Expression 22]}$$

$$= \frac{-N_n \Delta x \left( \frac{W_n}{W - W_n} + 1 \right)}{W}$$

$$= -N_n \cdot \Delta x \frac{1}{W - W_n}$$

Furthermore, the following expressions are derived by solving this expression for Δx, and the expression of dx/dz is derived from the following expressions.

$$\Delta x = -(W - Wn) \cdot \frac{1}{Nn} \cdot \Delta i \quad \text{[Expression 23]}$$

$$\frac{dx}{dz} = -(W - W_n) \cdot \frac{1}{N_n} \cdot \frac{di}{dz} \quad \text{[Expression 24]}$$

In this way, the column width change amount dx/dz can be expressed with the column pitch W, the width Wn of the n-type region 2b, the impurity concentration Nn and the surplus concentration gradient di/dz. Further, the angle θ can be calculated by substituting the right side of the expression 23 for the column width change amount dx/dz of the expression 17 described above. For example, when it is designed to have the withstand voltage of 600 V, the angle θ satisfying the expression 24 is equal to or greater than 88.8 degrees and less than 90 degrees.

As described above, in the case where the side surface of the p-type region 3 is inclined in the depth direction to form the tapered angle in the super junction structure, the angle θ of the side surface of the p-type region 3 relative to the planar direction of the substrate is set to satisfy the following expression.

$$\arctan\left(-2 \cdot \frac{1}{w - w_n} \cdot N_n \cdot \frac{1}{di/dz}\right) \times \frac{360}{2\pi} < \theta < 90° \quad \text{[Expression 25]}$$

By setting the angle θ in the manner described above, the desired withstand voltage is achieved without reducing the margin for the processing variation, and the withstand voltage yield will not be reduced.

Other Embodiment

Figure 10:
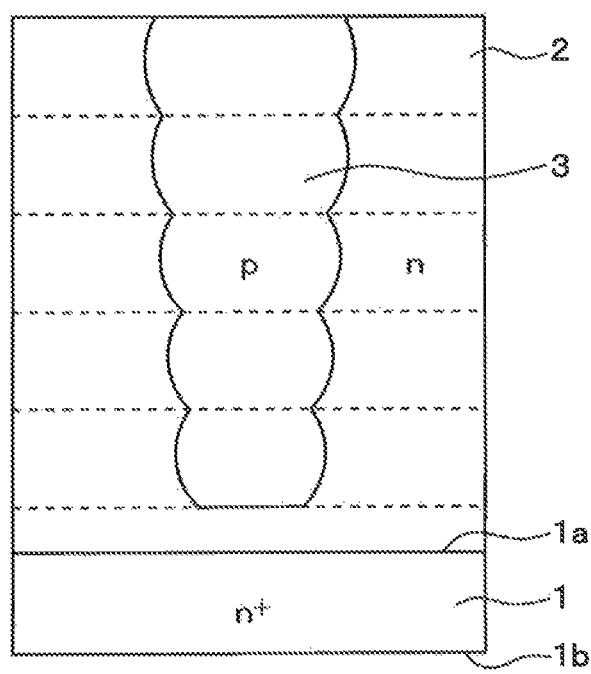
FIG. 10 is a cross-sectional view of a p-type region 3 formed by an ion-implantation according to another embodiment.

In the embodiment described above, the super junction structure is configured by embedding the p-type region 3 in the trench 2 formed in the n-type drift layer 2. However, the super junction structure may be configured without forming the trench 2a. In particular, as shown in FIG. 10, the n-type drift layer 2 is epitaxially grown on the front surface 1a of the n+-type substrate by a part of the entire thickness of the n-type drift layer 2, and then a p-type impurity is ion-implanted at a position where the p-type region 3 is to be formed. Further, the n-type drift layer 2 is further epitaxially grown by a part of the entire thickness of the n-type drift layer 2, and then the p-type impurity is ion-implanted at the position where the p-type region 3 is to be formed. In this case, the width of the ion-implantation is slightly increased from the width of the previous ion-implantation with respect to a direction in which the columns are arranged. Thereafter, the epitaxially growing step of the n-type drift layer 2 by the part of the entire thickness and the ion-implantation step of the p-type impurity for forming the p-type region 3 are repeated, and a thermal processing is performed. As such, the n-type drift layer 2 is formed to have a desired thickness, and the p-type region 3 is formed at the position where the ion-implantation is performed in the n-type drift layer 2. Therefore, even if a formation depth of the p-type region 3 is deep, the p-type region 3 can be formed by ion-implantation. In this way, the p-type region 3 may be formed by performing the ion-implantation of the p-type impurity to the n-type drift layer 2, in place of filling the trench 2a formed in the n-type drift layer 2 with the p-type region 3.

Further, in the embodiment described above, in the super junction structure where the side surface of the trench 2a, that is, the interface between the n-type region 2b and the p-type region 3 adjacent the n-type region 2b is inclined with respect to the depth direction to have the tapered angle, the interface is exemplary a flat surface. That is, in the embodiment described above, the interface has a straight shape in the cross-section shown in FIG. 1. However, it is not always necessary that the interface has the straight shape in the cross-section.

Figure 11A:
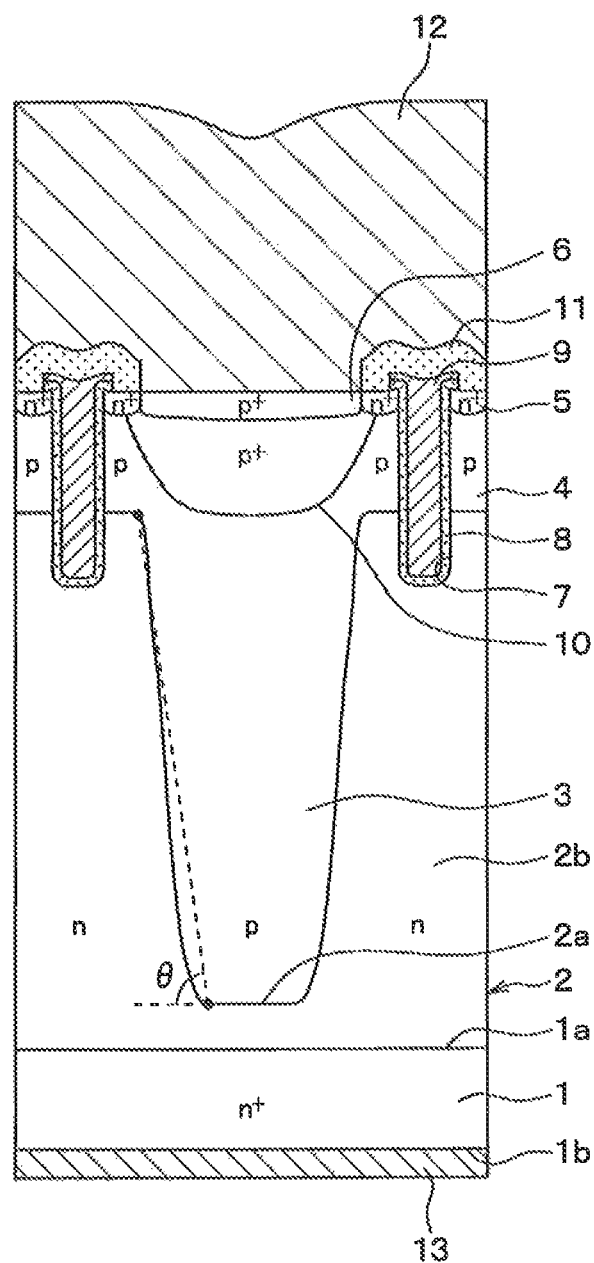
FIG. 11A is a cross-sectional view of a cell region Rc of a semiconductor device having a vertical MOS transistor described as another embodiment.
Figure 11B:
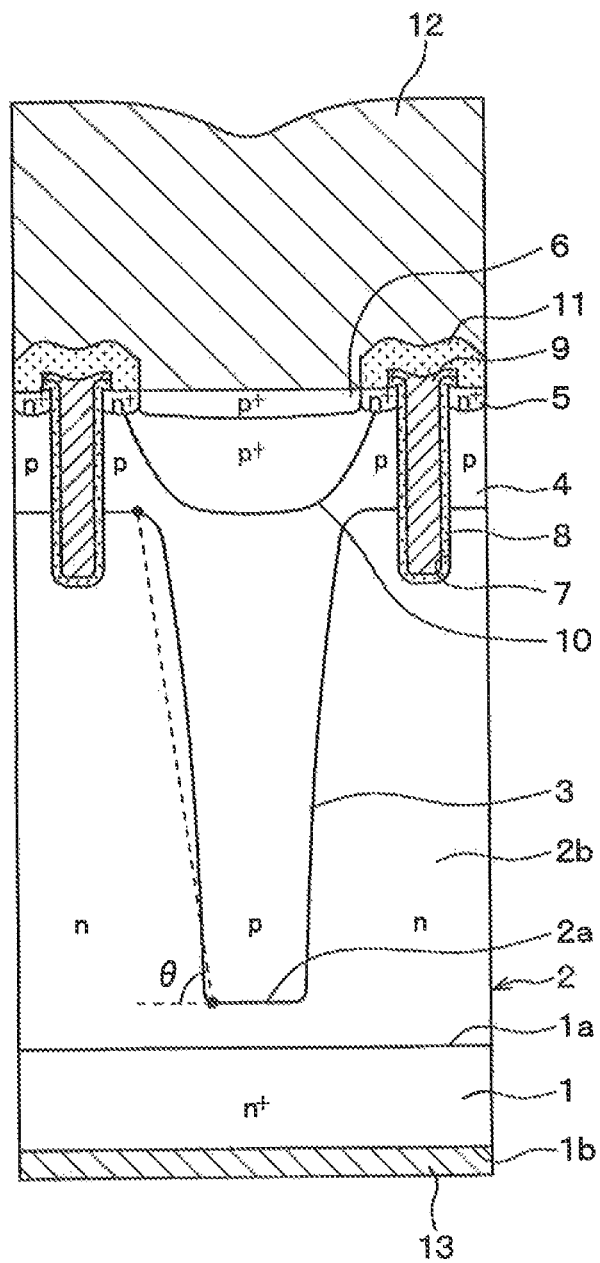
FIG. 11B is a cross-sectional view of a cell region Rc of a semiconductor device having a vertical MOS transistor described as another embodiment.

For example, as compared with the case where the interface between the n-type, region 2b and the p-type region 3 is a flat surface, the interface may be a curved surface such that the width of the p-type region 3 increases at a middle portion in the depth direction as shown in FIG. 11A. Alternatively, the interface may be a curved surface such that the width of the p-type region 3 reduces at a middle portion in the depth direction as shown in FIG. 11B. In these cases, the angle θ(=tapered angle) may be defined between a line connecting the top portion and the bottom portion of the p-type region 3, that is, a line connecting a corner at the narrowest portion and a corner at the widest portion and the planar direction of the substrate. The change of the surplus concentration i of the cases where the p-type region 3 indicates the shape shown in FIG. 11A and FIG. 11B is illustrated as shown in FIG. 12A and FIG. 12B. In these cases, the amount of change of the surplus concentration is not constant in the depth direction. However, a value obtained by dividing the amount of change of the entire surplus concentration i1-i2 by the entire depth z1-z2 of the super junction structure, that is, an average of the surplus concentration gradient of the entire depth ((i1-i2)/(z1- z2)) may be regarded as di/dz. When the di/dz, which is expressed by the average of the surplus concentration gradient in the entire depth of the super junction structure, satisfies the expression 1 described above, the desired withstand voltage is achieved without reducing the margin for the processing variation, and the withstand voltage yield will not be reduced.

Figure 13:
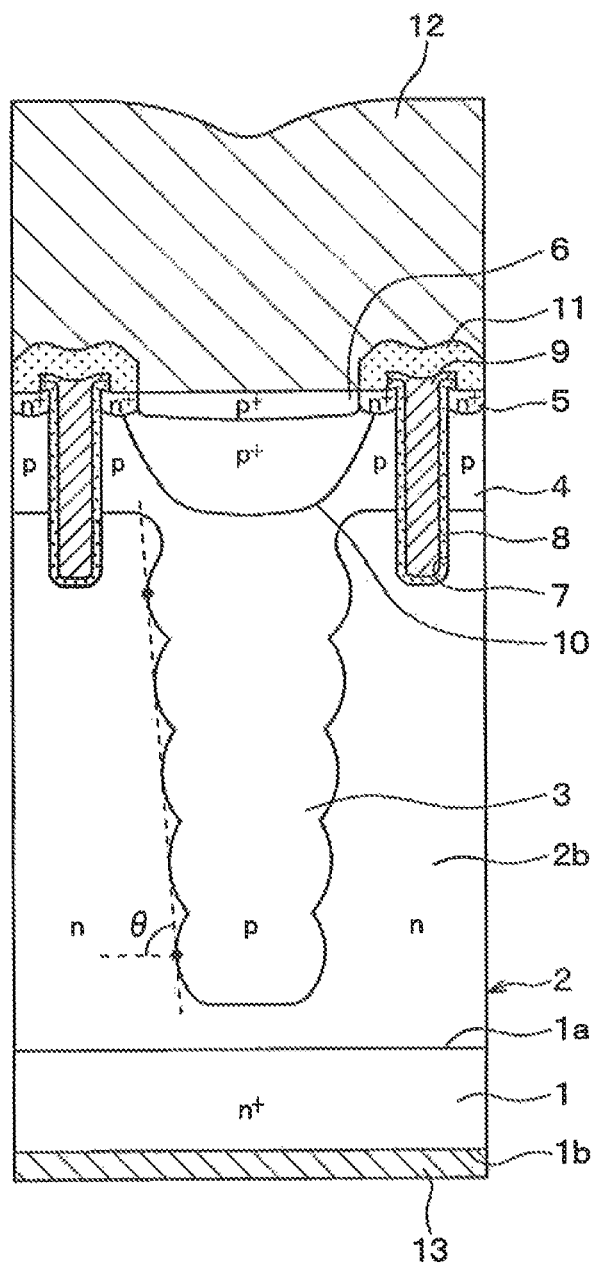
FIG. 13 is a cross-sectional view for illustrating a way of setting an angle θ in regard to a case where a p-type region 3 is formed by an ion-implantation described as the another embodiment.

In the case where the p-type region 3 is formed by the ion-implantation, as shown in FIG. 10, the angle θ may be defined as follows, in place of the top portion and the bottom portion of the p-type region 3. That is, an angle defined between the planar direction of the substrate and a line connecting a widest point of the lowest stage and a widest part of the highest stage within an ion-implanted regions formed in plural stages may be regarded as the angle θ, as shown in FIG. 13.

In the embodiment described above, the depth of the p-type region 3 is smaller than the thickness of the n-type drift layer 2. That is, the bottom of the p-type region 3 does not reach the bottom of the n-type drift layer 2, and the n-type drift layer 2 exists under the p-type region 3. On the other hand, it may be configured such that the p-type region 3 has the depth equal to the thickness of the n-type drift layer 2, and the p-type region 3 does not exist under the n-type drift layer 2. However, in the structure where the n-type drift layer 2 does not exist under the p-type region 3, the electric field increases at a lower part of the column, that is, a lower part of the super junction structure, and the central withstand voltage reduces. Therefore, when the n-type drift layer 2 exists under the p-type region 3 as in the embodiment described above, it is less likely that the electric field will increase at the lower part of the super junction structure and the central withstand voltage will reduce.

In the embodiment described above, an n-channel-type MOST transistor in which the first conductivity-type is the n-type and the second conductivity-type is the p-type is described. However, the present disclosure may be applied to a p-channel type MOS transistor in which the conductivity-type of each component element forming the element is inversed. Further, the present disclosure may be applied not only to the MOS transistor, but also to an IGBT. In such a case, a similar structure to each of the embodiments described above may be adopted. In this case, a p+-type substrate may be used, in place of the n+-type substrate. Further, the present disclosure may be applied to any device, such as a diode, as the vertical semiconductor element, other than the MOS transistor and the IGBT.

In the embodiment described above, it is exemplarily described about the case where the longitudinal direction of the trench gate structure and the longitudinal direction of the super junction structure are the same direction. However, the trench gate structure and the super junction structure may be configured to have a layout where the longitudinal direction thereof intersect with each other.

In the embodiment described above, it is exemplarily described about the trench gate structure in which the gate insulation film B and the gate electrode 9 are formed on the surface of the n-type drift layer 2 within the trench 7, as the gate structure. However, such a structure is only an example. The present disclosure may be applied to a semiconductor device having a planar-type gate structure in which the gate insulation film 8 and the gate electrode 9 are formed on the surface of the n-type drift layer 2 without forming the trench 7.

Also, it is exemplarily described about the semiconductor device having the super junction structure in which the side surface of the p-column has the tapered angle. However, the super junction structure is not limited to the structure having the tapered angle, and may be configured such that the surplus concentration gradient i satisfies the expression 1 described above in regard to a concentration relationship between the n-column and the p-column.

Further, in the embodiment described above, the silicon is exemplarily used as the semiconductor material. However, the present disclosure may be applied to the semiconductor substrate that is used for manufacturing a semiconductor device employing any other semiconductor material, such as silicon carbide and compound semiconductor.

Additional advantages and modifications will readily occur to those skilled in the art. The invention in its broader term is therefore not limited to the specific details, representative apparatus, and illustrative examples shown and described.

What is claimed is:

1. A semiconductor device comprising a vertical semiconductor element, the vertical semiconductor element including:
   a semiconductor substrate defining a first surface and a second surface, the semiconductor substrate having one of a first conductivity-type and a second conductivity-type;
   a first conductivity-type drift layer disposed on the first surface of the semiconductor substrate; and
   a plurality of second conductivity-type regions each having a stripe shape defining a longitudinal direction in one direction, wherein
   the second conductivity-type regions are disposed in the drift layer, and the first conductivity-type drift layer defines first conductivity-type regions between the second conductivity-type regions,
   the first conductivity-type regions and the second conductivity-type regions are arranged alternately and repetitively at a predetermined column pitch, thereby to provide a super junction structure,
   the vertical semiconductor element allows an electric current to flow between a first electrode disposed adjacent to the first surface of the semiconductor substrate and a second electrode disposed adjacent to the second surface of the semiconductor substrate, and
   when a surplus concentration that is a value obtained by dividing a difference between an electrical charge in the second conductivity-type region and an electrical charge in the first conductivity-type region by the column pitch is referred to as i, a depth of the super junction structure is referred to as z, a surplus concentration gradient as a change of the surplus concentration i per unit depth is referred to as di/dz, and a central withstand voltage in which a margin is added to a desired withstand voltage is referred to as $V_{max}$ the super junction structure is configured such that the surplus concentration gradient di/dz satisfies a relationship of $$0 > \frac{di}{dz} > -\left(\frac{7.97 \times 10^{11}}{V_{max}}\right)^2 \cdot \frac{1}{10000}.$$

2. The semiconductor device having the vertical semiconductor element according to claim 1, wherein a depth of the second conductivity type regions is smaller than a thickness of the drift layer, and the drift layer exists under the second conductivity-type regions.

3. The semiconductor device having the vertical semiconductor element according to claim 1, wherein, when the predetermined column pitch is referred to as W, a width of the first conductivity-type region is referred to as Wn, and an impurity concentration of the first conductivity-type region is referred to as Nn, both side surfaces of the second conductivity-type region form an angle θ relative to a planar direction of the substrate, the angle θ satisfying a relationship of $$\arctan\left(-2 \cdot \frac{1}{W-W_n} \cdot N_n \cdot \frac{1}{di/dz}\right) \times \frac{360}{2\pi} < \theta < 90°.$$

4. The semiconductor device having the vertical semiconductor element according to claim 1, wherein the vertical semiconductor element has a withstand voltage of equal to or greater than 300 V, and the surplus concentration gradient is less than $-3.9 \times 10^{14}$ cm$^{-1}$ μm$^{-1}$.

5. The semiconductor device having the vertical semiconductor element according to claim 1, wherein the vertical semiconductor element has a withstand voltage of equal to or greater than 600 V and the surplus concentration gradient is less than $-1.1 \times 10^{14}$ cm$^{-3}$ μm$^{-1}$.

6. The semiconductor device having the vertical semiconductor element according to claim 1, wherein the vertical semiconductor element has a withstand voltage of equal to or greater than 1200 V, and the surplus concentration gradient is $-3.0 \times 10^{13}$ cm$^{-3}$ μm$^{-1}$.

7. The semiconductor device having the vertical semiconductor element according to claim 1, wherein
the vertical semiconductor element is provided with a gate structure,
the gate structure includes a second conductivity-type base region disposed on the super junction structure, a first conductivity-type first impurity region that is disposed in a surface layer portion of the base region and has an impurity concentration greater than the drift layer, a gate insulation film disposed on a surface of the drift layer, and a gate electrode disposed on a surface of the gate insulation film,
the vertical semiconductor element includes a second, conductivity-type contact region disposed in the surface layer portion of the base region opposite to the gate structure with respect to the first impurity region, the second conductivity-type contact region has an impurity concentration greater than the base region,
the first electrode is electrically coupled to the first impurity region and the contact region,
the second electrode is electrically coupled to the semiconductor substrate, and
the vertical semiconductor element allows the electric current to flow between the first electrode and the second electrode according to a voltage applied to the gate electrode.

* * * * *